US012590999B2

(12) United States Patent
Nomura et al.

(10) Patent No.: US 12,590,999 B2
(45) Date of Patent: Mar. 31, 2026

(54) SEMICONDUCTOR TESTING APPARATUS AND METHOD OF MANUFACTURING SEMICONDUCTOR DEVICE

(71) Applicant: Mitsubishi Electric Corporation, Tokyo (JP)

(72) Inventors: Noritsugu Nomura, Tokyo (JP); Takuya Yoshimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 133 days.

(21) Appl. No.: 18/414,413

(22) Filed: Jan. 16, 2024

(65) Prior Publication Data

US 2024/0295599 A1 Sep. 5, 2024

(30) Foreign Application Priority Data

Mar. 2, 2023 (JP) ................................. 2023-031564

(51) Int. Cl.
*G01R 31/10* (2006.01)
*G01R 31/26* (2020.01)

(52) U.S. Cl.
CPC ................................. *G01R 31/2601* (2013.01)

(58) Field of Classification Search
CPC .... G01R 31/26; G01R 31/2601; G01R 31/28; G01R 31/2881; G01R 31/2862
See application file for complete search history.

(56) References Cited

U.S. PATENT DOCUMENTS

| 2003/0137317 A1* | 7/2003 | Kim ..................... | G01R 1/0483 |
| | | | 324/750.03 |
| 2005/0151549 A1* | 7/2005 | Okumura ........... | G01R 31/2898 |
| | | | 324/754.11 |
| 2007/0247177 A1* | 10/2007 | Ruckenbauer ..... | G01R 31/2891 |
| | | | 324/750.19 |
| 2011/0309850 A1 | 12/2011 | Yoshida et al. | |
| 2014/0210500 A1 | 7/2014 | Akiyama et al. | |
| 2017/0299629 A1* | 10/2017 | Tsai ................... | G01R 1/06777 |
| 2023/0258690 A1* | 8/2023 | Zhao ................... | G01R 31/2886 |
| | | | 324/149 |

FOREIGN PATENT DOCUMENTS

| JP | 2011-252792 A | 12/2011 |
| JP | 2014-145615 A | 8/2014 |

OTHER PUBLICATIONS

"Notice of Reasons for Refusal" Office Action issued in JP 2023-031564; mailed by the Japanese Patent Office on Dec. 16, 2025.

* cited by examiner

*Primary Examiner* — Thang X Le

(74) *Attorney, Agent, or Firm* — Studebaker Brackett PLLC

(57) ABSTRACT

Occurrence of partial discharge is reduce and the test of electrical properties of a semiconductor device is and stably performed. A semiconductor testing apparatus includes a stage, a probe, a separation section, and a gas supply section. The probe performs electrical input and output to and from the semiconductor device held on the stage. The separation section separates the space above the semiconductor device held on the stage into the pressurized space and the probe space including the probe. The gas supply section supplies gas to the pressurized space to pressurize the pressurized space.

11 Claims, 10 Drawing Sheets

F I G.  1
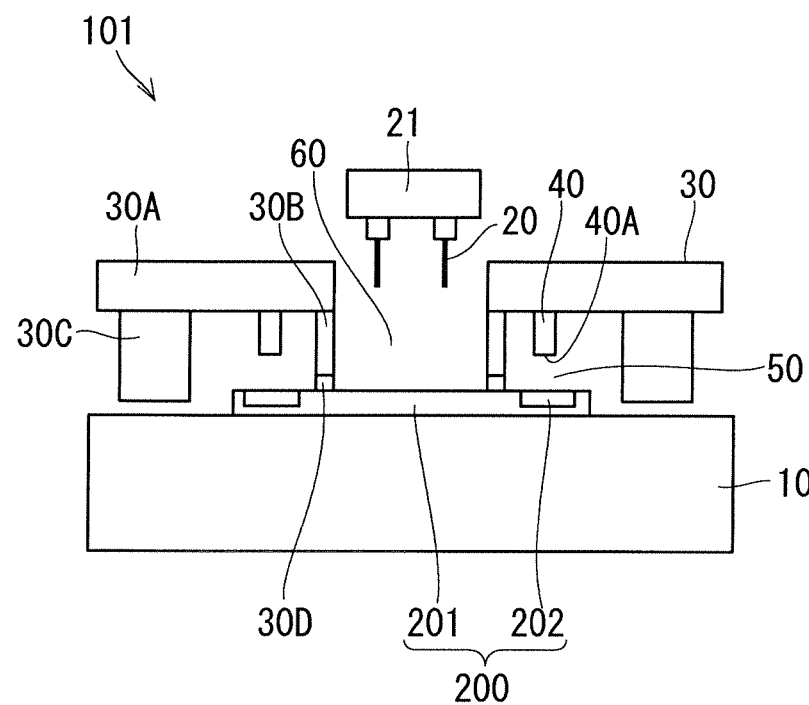

F I G. 3
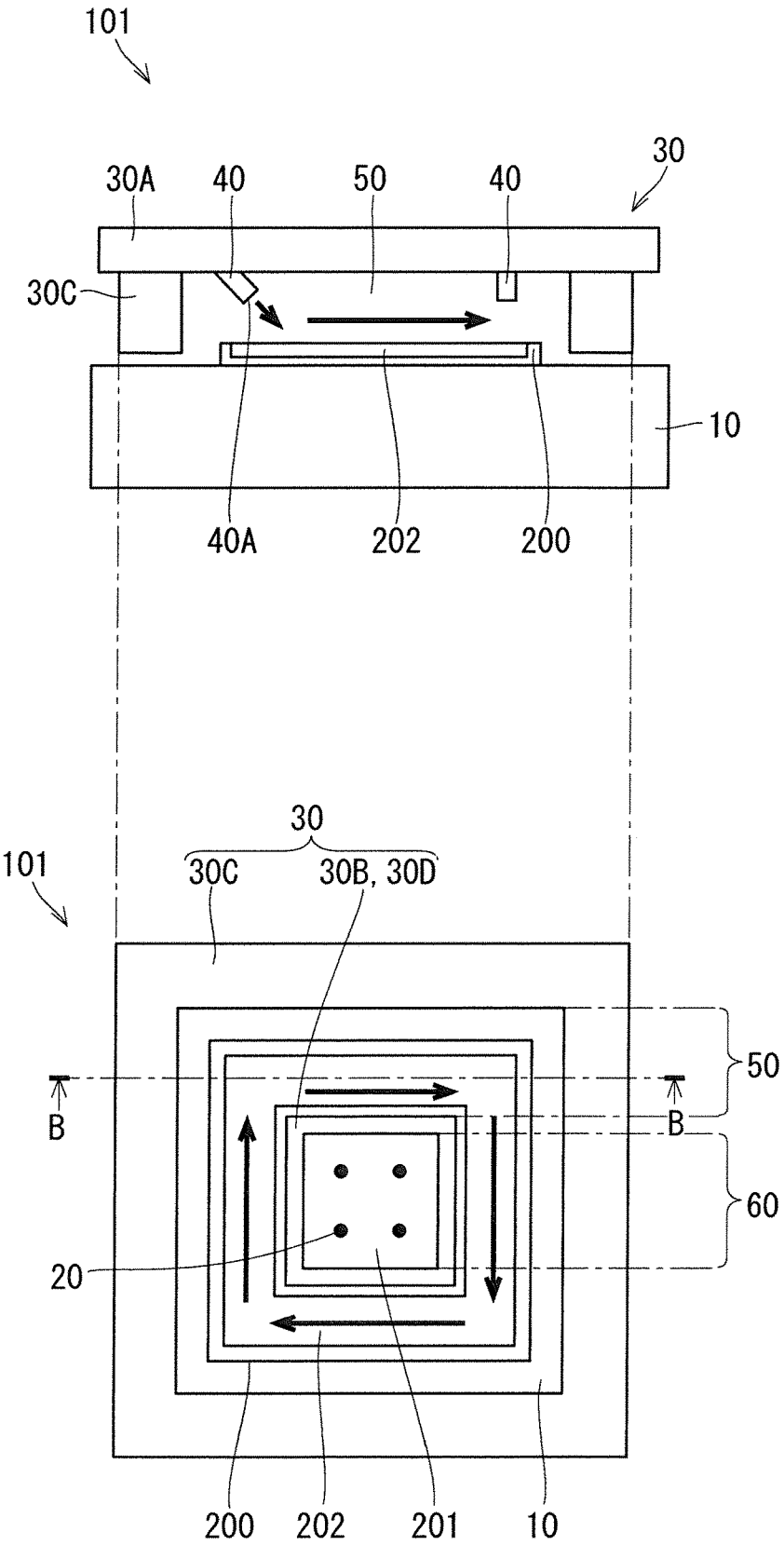

F I G.  4

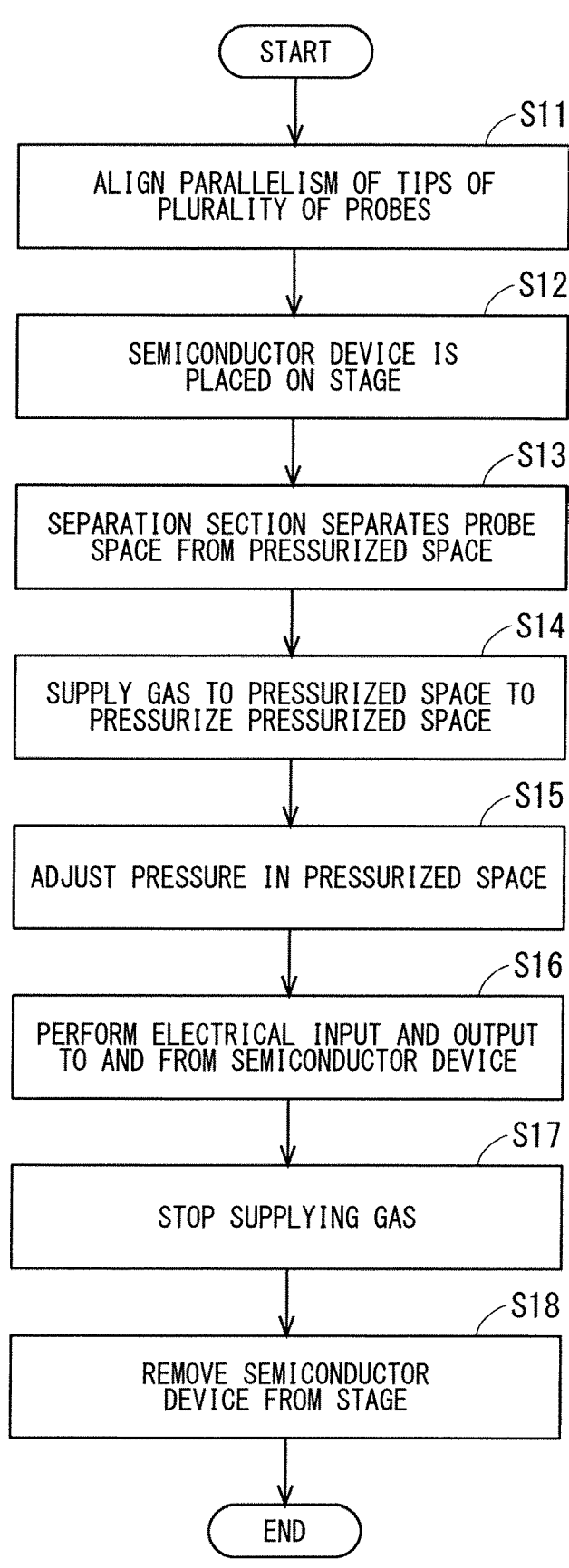

START

S11
ALIGN PARALLELISM OF TIPS OF
PLURALITY OF PROBES

S12
SEMICONDUCTOR DEVICE IS
PLACED ON STAGE

S13
SEPARATION SECTION SEPARATES PROBE
SPACE FROM PRESSURIZED SPACE

S14
SUPPLY GAS TO PRESSURIZED SPACE TO
PRESSURIZE PRESSURIZED SPACE

S15
ADJUST PRESSURE IN PRESSURIZED SPACE

S16
PERFORM ELECTRICAL INPUT AND OUTPUT
TO AND FROM SEMICONDUCTOR DEVICE

S17
STOP SUPPLYING GAS

S18
REMOVE SEMICONDUCTOR
DEVICE FROM STAGE

END

F I G. 5
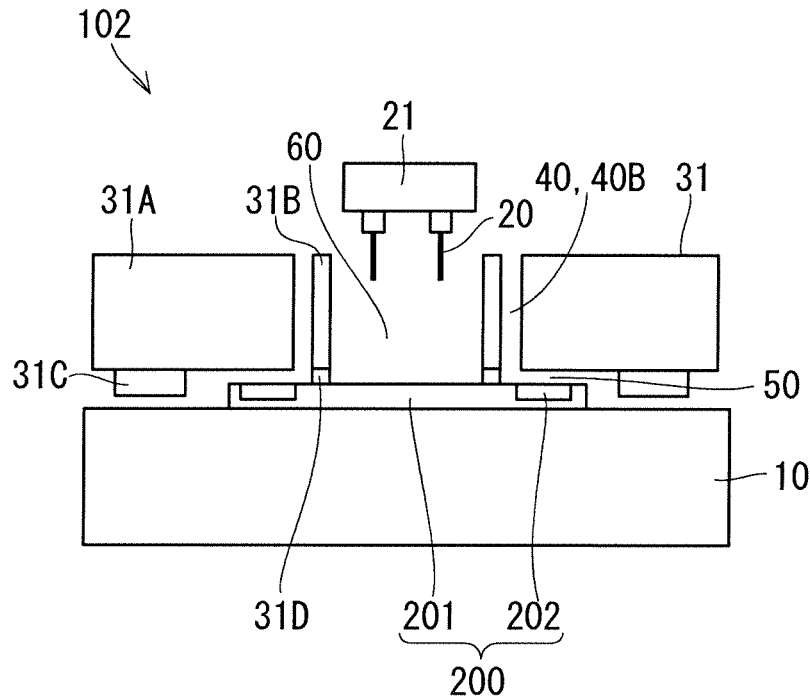

F I G.  6
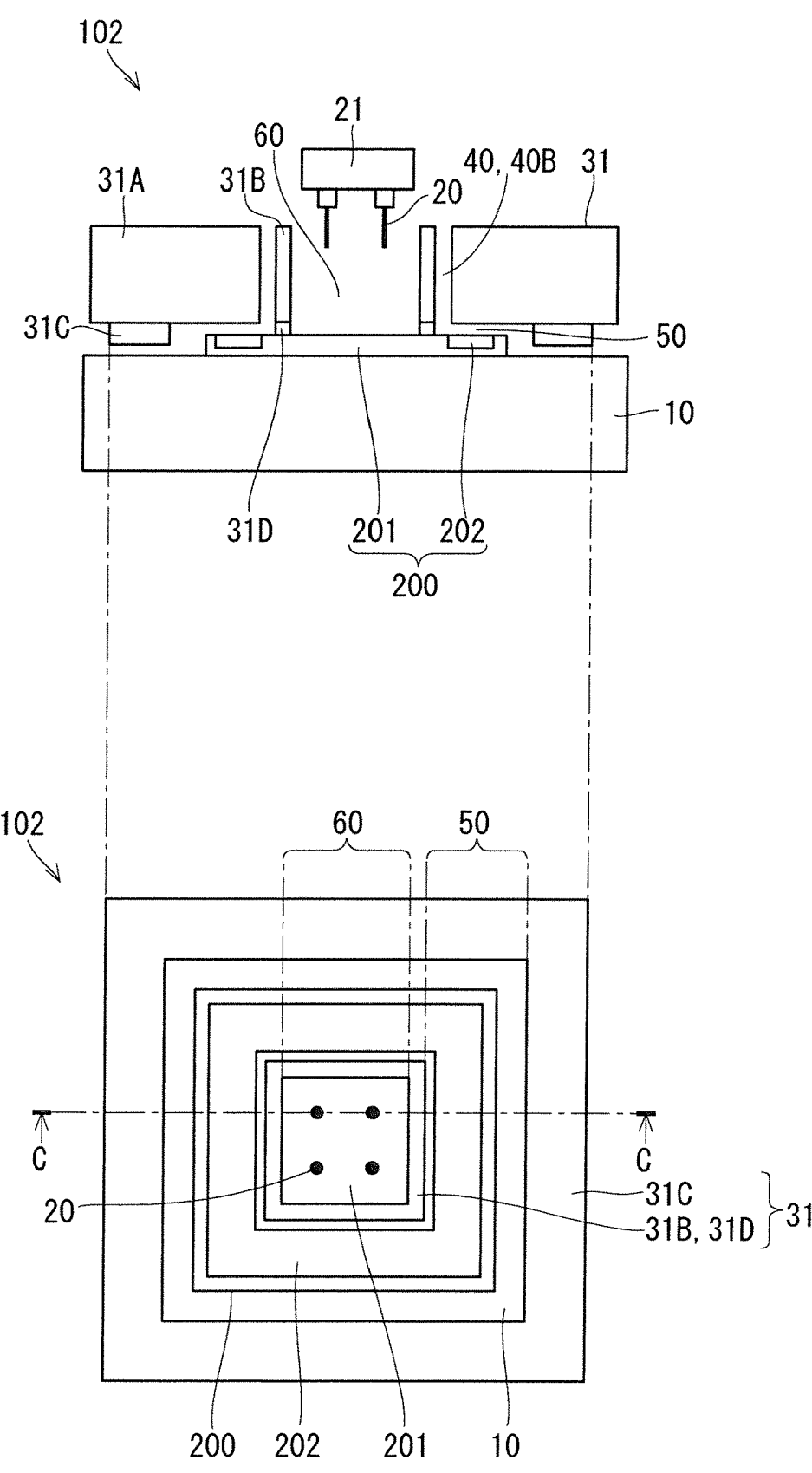

F I G.  7
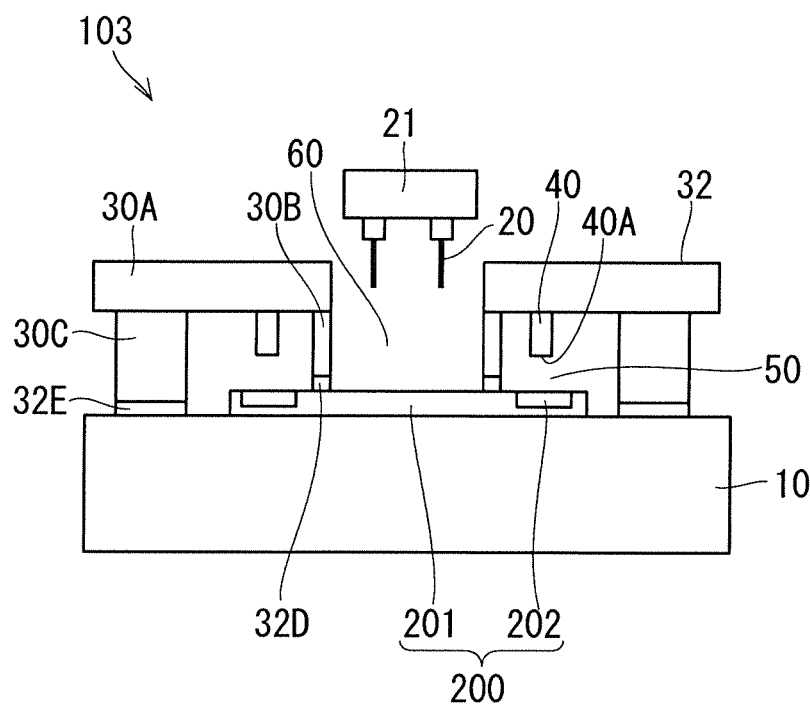

F I G . 8
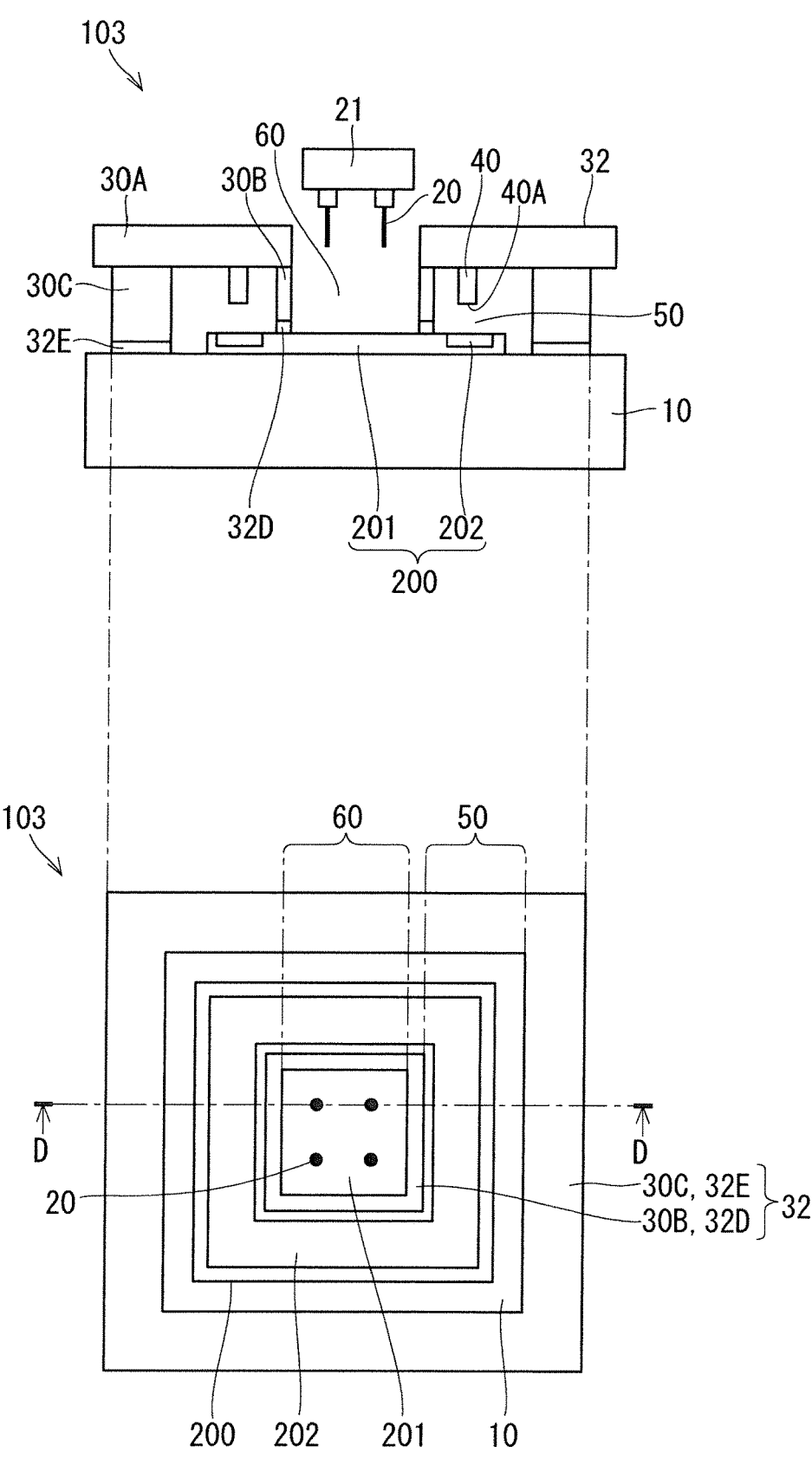

F I G.   9
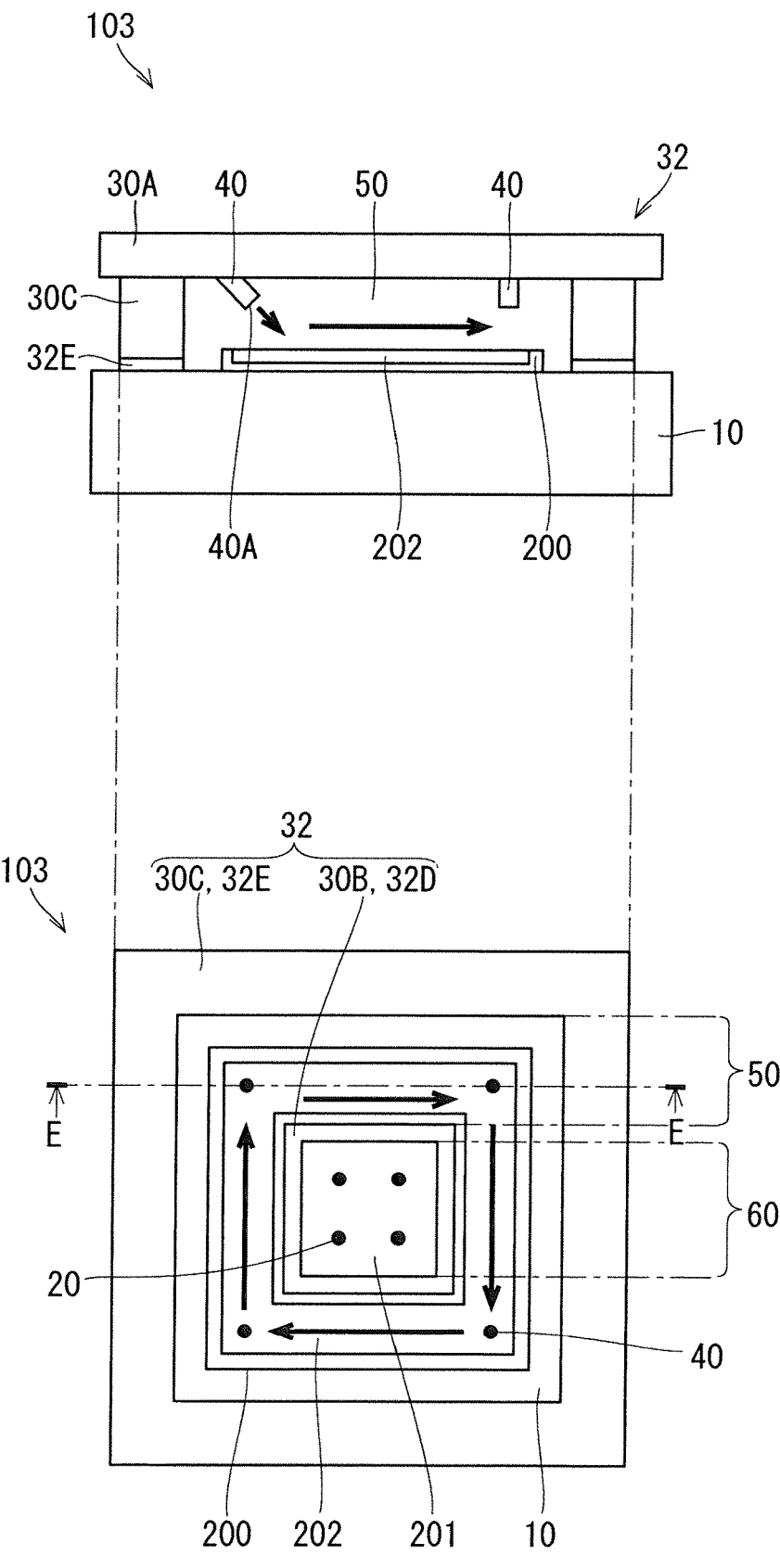

F I G .　1 0
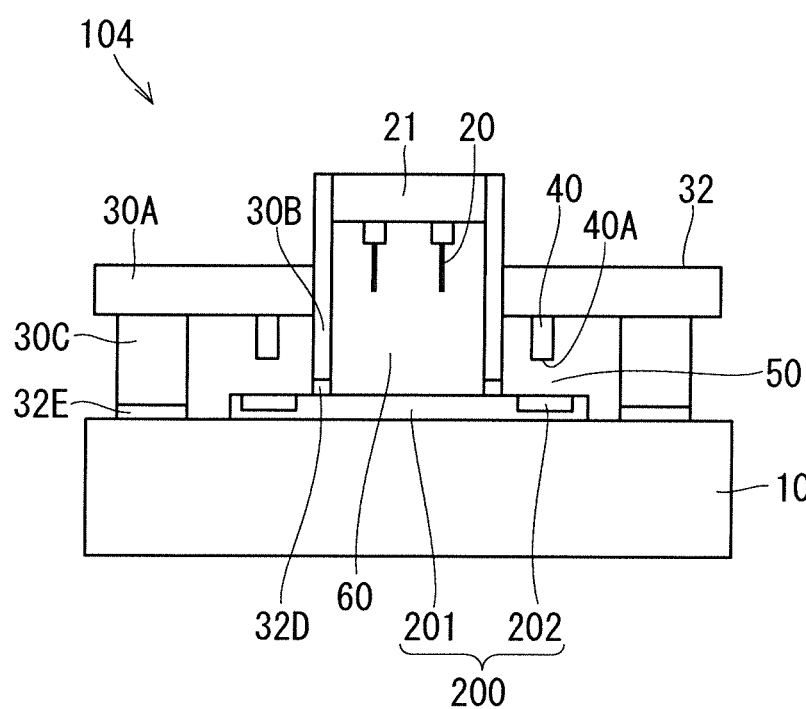

1

SEMICONDUCTOR TESTING APPARATUS AND METHOD OF MANUFACTURING SEMICONDUCTOR DEVICE

BACKGROUND OF THE INVENTION

Field of the Invention

The present disclosure relates to a semiconductor testing apparatus and a method of manufacturing a semiconductor device.

Description of the Background Art

A semiconductor testing apparatus that evaluates the electrical properties of a semiconductor device brings a probe for electrical input and output into contact with an electrode provided on the surface of the semiconductor device. When a semiconductor device has a vertical structure in which the current flows in the vertical direction, i.e., in the direction perpendicular to the surface, in some cases, discharge, hereinafter referred to as partial discharge, may occur between a portion of the semiconductor device at the same potential as the stage and an electrode on the surface of the semiconductor device during testing. The partial discharge causes partial damage to the semiconductor device or malfunction of the semiconductor device.

The testing apparatus disclosed in Japanese Patent Application Laid-open No. 2011-252792 performs the test under the condition where the pressure inside the pressure vessel in which a testing object is placed is pressurized. With this, the testing apparatus prevents partial discharge that occurs during high voltage testing of the testing object.

In terms of probes for semiconductor testing apparatuses, there is a trend towards reducing the diameter of probes, and various types of probes, including fine wire probes, have been proposed. Depending on the type of probe, there is a possibility of probe deformation when gas is introduced into the pressure vessel. Such deformations affect the quality of testing the electrical properties of semiconductor devices.

SUMMARY

An object of the present disclosure is to provide a semiconductor testing apparatus that can reduce the occurrence of partial discharge and stably perform the test of electrical properties of a semiconductor device.

The semiconductor testing apparatus according to the present disclosure is configured to evaluate electrical properties of a semiconductor device. The semiconductor testing apparatus includes a stage, a probe, a separation section, and a gas supply section. The probe performs electrical input and output to and from the semiconductor device held on the stage. The separation section separates the space above the semiconductor device held on the stage into the pressurized space and the probe space including the probe. The gas supply section supplies gas to the pressurized space to pressurize the pressurized space.

Provided is a semiconductor testing apparatus that can reduce the occurrence of partial discharge and stably perform the test of electrical properties of a semiconductor device.

These and other objects, features, aspects and advantages of the present invention will become more apparent from the following detailed description of the present invention when taken in conjunction with the accompanying drawings.

2

BRIEF DESCRIPTION OF THE DRAWINGS

FIG. 1 is a cross-sectional view illustrating a configuration of a semiconductor testing apparatus according to Embodiment 1;

FIG. 3 is a diagram illustrating a cross-sectional configuration and a planar configuration of the semiconductor testing apparatus;

FIG. 4 is a flowchart illustrating a method of manufacturing the semiconductor device according to Embodiment 1;

FIG. 5 is a cross-sectional view illustrating a configuration of a semiconductor testing apparatus according to Embodiment 2;

FIG. 6 is a diagram illustrating a cross-sectional configuration and a planar configuration of the semiconductor testing apparatus;

FIG. 7 is a cross-sectional view illustrating a configuration of a semiconductor testing apparatus according to Embodiment 3;

FIG. 8 is a diagram illustrating a cross-sectional configuration and a planar configuration of the semiconductor testing apparatus;

FIG. 9 is a diagram illustrating a cross-sectional configuration and a planar configuration of the semiconductor testing apparatus; and FIG. 10 is a cross-sectional view illustrating a configuration of a semiconductor testing apparatus according to Modification of Embodiment 3.

DESCRIPTION OF THE PREFERRED EMBODIMENTS

Embodiment 1

(Configuration of Semiconductor Testing Apparatus)

Figure 2:
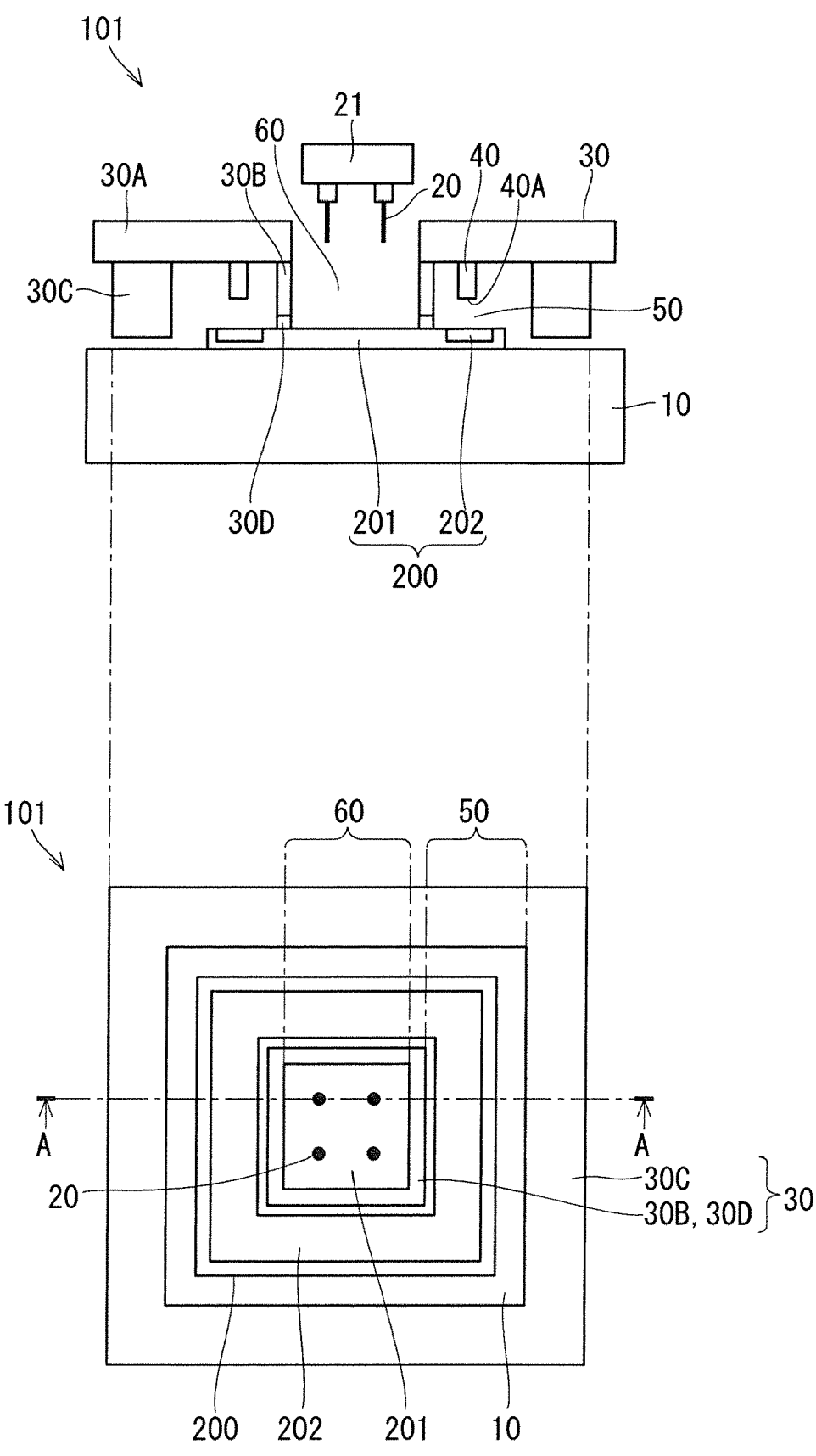
FIG. 2 is a diagram illustrating a cross-sectional configuration and a planar configuration of the semiconductor testing apparatus.

FIG. 1 is a cross-sectional view illustrating a configuration of a semiconductor testing apparatus 101 according to Embodiment 1. FIG. 2 is a diagram illustrating a cross-sectional configuration and a planar configuration of the semiconductor testing apparatus 101. The cross-sectional view illustrated on the upper side of FIG. 2 illustrates the cross section taken along A-A illustrated in the plan view illustrated on the lower side. FIG. 3 is a diagram illustrating a cross-sectional configuration and a planar configuration of the semiconductor testing apparatus 101. The cross-sectional view illustrated on the upper side of FIG. 3 illustrates the cross section taken along B-B illustrated in the plan view illustrated on the lower side. The plan views in FIGS. 2 and 3 illustrate the planar configuration of the semiconductor testing apparatus 101, with some parts seen through.

The semiconductor testing apparatus 101 evaluates electrical properties of a semiconductor device 200, which is a testing object. The semiconductor device 200 may be in a state of an individualized semiconductor chip cut out from a wafer, or in a state of a semiconductor wafer before individualization in which a plurality of semiconductor chips are integrated thereon. The semiconductor device 200 is formed of a semiconductor such as Si, or a so-called wide bandgap semiconductor such as SiC, GaN, $Ga_2O_3$, or diamond. The semiconductor device 200 represents, for example, a semiconductor device for power control, a so-called power semiconductor device. The semiconductor device 200 includes a plurality of semiconductor elements (not illustrated). These semiconductor elements represent an Insulated Gate Bipolar Transistor (IGBT), a Metal-Oxide-Semiconductor Field-Effect Transistor (MOSFET), a Schottky barrier diode, and the like. Alternatively, the semiconductor elements may also represent a Reverse-Conducting IGBT (RC-IGBT) in which an IGBT and a freewheeling diode are formed on a single semiconductor substrate.

A front surface electrode (not illustrated) is provided on the upper surface of the semiconductor device 200 in Embodiment 1, and a back surface electrode (not illustrated) is provided on the lower surface thereof. The semiconductor device 200 has a vertical structure in which a current flows between its front surface electrode and its back surface electrode. Further, the semiconductor device 200 includes an element formation region 201 and a breakdown voltage holding region 202. The semiconductor elements are formed in the element formation region 201. A breakdown voltage holding structure for maintaining the breakdown voltage of the semiconductor device 200 is formed in the breakdown voltage holding region 202. The breakdown voltage holding structure in Embodiment 1 is formed so as to enclose the surroundings of the element formation region 201 in plan view. The breakdown voltage holding structure is represented by, for example, a Field Limiting Ring (FLR) formed in the front layer on the upper surface side of the semiconductor device 200.

The semiconductor testing apparatus 101 includes a stage 10, a plurality of probes 20, a separation section 30, a gas supply section 40, and a pressure adjustment section (not illustrated).

The stage 10 serves as a base to hold the semiconductor device 200. The front surface of the stage 10 is electrically connected to an external device (not illustrated) and functions as one electrode in the semiconductor testing apparatus 101. During testing, the semiconductor device 200 is placed on the stage 10, and the front surface of the stage 10 comes into contact with the back surface electrode of the semiconductor device 200. In the semiconductor testing apparatus 101 in Embodiment 1, the semiconductor device 200 is fixed to the front surface of the stage 10 by vacuum suction. The fixing means, that is, the holding means is not limited to vacuum suction and electrostatic suction or the like may also be adoptable. The stage 10 can hold one or a plurality of semiconductor devices. For a concise description, consider one semiconductor device 200 being held on the stage 10.

Each of the plurality of probes 20 performs electrical input and output to and from the semiconductor device 200 held on the stage 10. The probes 20 are attached to a probe board 21 via sockets. The probes 20, which are electrically connected to an external device, function as other electrodes of the semiconductor testing apparatus 101. During testing, the probes 20 come into contact with the front surface electrode of the semiconductor device 200. The plurality of probes 20 provided allows the semiconductor testing apparatus 101 to apply a current of 5 A or more to the semiconductor device 200.

The separation section 30 includes an upper plate 30A, a first side wall 30B, a second side wall 30C, and a protection member 30D. The first side wall 30B and the second side wall 30C are provided on the lower surface of the upper plate 30A. The protection member 30D is provided at the lower end of the first side wall 30B. The protection member 30D is made of, for example, a flexible elastic body. The cross sectional form comprised of the upper plate 30A, the first side wall 30B, the second side wall 30C, and the protection member 30D takes an inverted U-shape. In other words, the separation section 30 forms a tunnel-like space in cross-sectional view. Also, the separation section 30 has an encircling structure in the form of the tunnel-like space in plan view. That is, the separation section 30 has a ring shape in plan view.

The positions of the first side wall 30B and the second side wall 30C are preferably determined based on the arrangement of the element formation region 201 and the breakdown voltage holding region 202 in the semiconductor device 200 held on the stage 10. For example, the first side wall 30B is provided so that the protection member 30D contacts a region inside the semiconductor device 200 further inward than the breakdown voltage holding region 202 during testing. The second side wall 30C is preferably provided so as to be located outside the outer edge portion of the semiconductor device 200 during testing.

The separation section 30 covers a pressurized space 50 corresponding to the space above the breakdown voltage holding region 202 among the spaces above the semiconductor device 200 held on the stage 10 during testing. In other words, the pressurized space 50 corresponds to a tunnel-like space encircled by the separation section 30 and the breakdown voltage holding region 202. The first side wall 30B separates a probe space 60 from the pressurized space 50 in the space above the semiconductor device 200. The probe space 60 corresponds to a space that includes the probes 20 facing the upper surface of the semiconductor device 200. In other words, the probe space 60 corresponds to a space that includes the probes 20 located above the element formation region 201.

A gas supply section 40 is provided on the separation section 30. During testing, the gas supply section 40 supplies gas to the pressurized space 50 to pressurize the pressurized space 50. The gas supply section 40 is controlled to be able to supply gas based on detection of contact between the protection member 30D of the first side wall 30B and the front surface of the semiconductor device 200.

In Embodiment 1, a plurality of gas supply sections are provided. At least one gas supply section 40 among the plurality of gas supply sections includes an ejection port 40A installed to blow gas from an oblique direction to the upper surface of the semiconductor device 200 as illustrated in FIG. 3. Here, the ejection port 40A is installed at an angle with respect to the upper plate 30A of the separation section 30. Further, the gas supply sections 40 are provided so that the gas blown out from the ejection ports 40A forms a flow that circulates around the ring-shaped pressurized space 50. Further, the gas supply sections 40 are preferably provided so as to uniformly pressurize the pressurized space 50 when supplying gas.

A pressure adjustment section (not illustrated) adjusts the pressure in the pressurized space 50. The pressure adjustment section adjusts the pressure in the pressurized space 50 by controlling the supply amount of gas to be supplied to the pressurized space 50 by the gas supply sections 40, for example.

(Method of Manufacturing Semiconductor Device)

Next, a method of manufacturing the semiconductor device 200 using the semiconductor testing apparatus 101 will be explained. FIG. 4 is a flowchart illustrating the method of manufacturing the semiconductor device 200 according to Embodiment 1. The manufacturing method is a method of manufacturing the semiconductor device 200 including a manufacturing process of evaluating the electrical properties of the semiconductor device 200 using the semiconductor testing apparatus 101. The manufacturing process that makes the evaluation will be described below.

In Step S11, align the parallelism of the contact sections corresponding to the tips of the plurality of probes 20.

In Step S12, the semiconductor device 200 is placed on the stage 10. The semiconductor device 200 is placed, for example, at a predetermined position on the stage 10. The semiconductor device 200 placed on the stage 10 is fixed, i.e., held on the stage 10, by vacuum suction or the like.

In Step S13, the separation section 30 descends and approaches the semiconductor device 200. The separation section 30 covers a pressurized space 50 corresponding to the space above the breakdown voltage holding region 202 among the spaces above the semiconductor device 200 held on the stage 10. As the separation section 30 descends, the protection member 30D of the first side wall 30B comes into contact with the upper surface of the semiconductor device 200. The protection member 30D preferably contacts a region inside the semiconductor device 200 further inward than the breakdown voltage holding region 202. The first side wall 30B separates the probe space 60 from the pressurized space 50. The second side wall 30C is located outside the outer edge portion of the semiconductor device 200. The lower end of the second side wall 30C is not in contact with the stage 10.

In Step S14, the gas supply sections 40 supply gas to the pressurized space 50 to pressurize the pressurized space 50. The gas supply sections 40 in Embodiment 1 are controlled to be able to supply gas based on detection of contact between the protection member 30D of the first side wall 30B and the front surface of the semiconductor device 200. The ejection port 40A of the gas supply section 40 illustrated in FIG. 3 in Embodiment 1 blows gas toward the breakdown voltage holding region 202 of the semiconductor device 200 from an oblique direction. The gas blown from the oblique direction removes foreign matter adhering to the breakdown voltage holding region 202 of the semiconductor device 200. Also, the gas, which is blown out in an oblique direction, causes a clockwise or counterclockwise gas flow in the ring-shaped pressurized space 50. The flow of gas also effectively lifts up and blows away foreign matter adhering to the semiconductor device 200. Foreign matter is discharged from the gap between the lower end of the second side wall 30C and the stage 10 since the second side wall 30C is not in contact with the stage 10.

In Step S15, the pressure adjustment section adjusts the pressure in the pressurized space 50 to the set pressure. The pressure adjustment section adjusts the supply amount of gas to be supplied to the pressurized space 50, for example, by the gas supply sections 40. The set pressure depends on the temperature and applied voltage during testing, but it is, for example, 20 kPa or higher. The Step S15 may be executed simultaneously with Step S14.

In Step S16, the plurality of probes 20 descend and contact the front surface electrode of the semiconductor device 200. The semiconductor testing apparatus 101 starts testing by passing a current through the semiconductor elements through the probes 20. In other words, the semiconductor testing apparatus 101 performs electrical input and output to and from the semiconductor device 200 through the probes 20. During the testing, the pressure in the pressurized space 50 is higher than the pressure in the probe space 60. In other words, the pressurized space 50 is pressurized. As a result, the possibility of partial discharge occurring in the breakdown voltage holding region 202 is lowered. The Step S16 may either be executed after Step S15 or be executed simultaneously with Step S15.

In Step S17, the gas supply sections 40 stop supplying gas. The pressure in the pressurized space 50 returns to its original state. The probes 20 and the separation section 30 are separated from the front surface of the semiconductor device 200.

In Step S18, the semiconductor device 200 that has been tested is removed from the stage 10. With this, the testing of the semiconductor device 200 is completed, and the semiconductor device 200 is sent to the next manufacturing process. After that, the semiconductor testing apparatus 101 tests another semiconductor device. That is, Step S11 or Step S12 is executed again.

In such a configuration, during testing, the space around the breakdown voltage holding region 202 where partial discharge is prone to occur, that is, the pressurized space 50, is pressurized. Therefore, the possibility of occurrence of partial discharge is lowered.

When gas is supplied from the gas supply sections 40 to the pressurized space 50, the pressurized space 50 is separated from the probe space 60 by the first side wall 30B. Therefore, high pressure gas is not directly blown to the probes 20 in the probe space 60. Therefore, regardless of the type of probes 20, deformation of the probes 20 due to blowing is suppressed. For example, even when using small-diameter, thin pin-type probes or fine wire-type probes, deformations of those probes 20 caused by blowing are suppressed. The deformation of the probes 20 is suppressed to be caused by contact; therefore, the semiconductor testing apparatus 101 stably performs the test of the electrical properties of the semiconductor device 200.

The probes 20 are not affected by the gas supply; therefore, the gas supply sections 40 can blow the gas strongly into the breakdown voltage holding region 202 of the semiconductor device 200. As a result, the removal rate of foreign matter from the breakdown voltage holding region 202 is improved, and the possibility of occurrence of partial discharge is further lowered.

Further, only the pressurized space 50 where partial discharge is prone to occur is pressurized by the separation section 30; therefore, the amount of gas used is reduced and the pressurization process is made more efficient.

To summarize the above, the semiconductor testing apparatus 101 in Embodiment 1 evaluates the electrical properties of the semiconductor device 200. The semiconductor testing apparatus 101 includes the stage 10, the probes 20, the separation section 30, and the gas supply sections 40. The probes 20 perform electrical input and output to and from the semiconductor device 200 held on the stage 10. The separation section 30 separates the space above the semiconductor device 200 held on the stage 10 into the pressurized space 50 and the probe space 60. The pressurized space 50 corresponds to the space above the breakdown voltage holding region 202 formed in the semiconductor device 200 to maintain the breakdown voltage of the semiconductor device 200. The probe space 60 includes the probes 20 facing the semiconductor device 200. The gas supply sections 40 supply gas to the pressurized space 50 to pressurize the pressurized space 50.

Such a semiconductor testing apparatus 101 reduces the occurrence of partial discharge and stably performs the test of the electrical properties of the semiconductor device 200. As a result of reducing the occurrence of defective products due to partial discharge and accurately evaluating electrical properties, the yield and reliability of the semiconductor device 200 improve.

The semiconductor testing apparatus 101 is required to apply a large current or high voltage depending on the specifications of the semiconductor device 200 to be tested. In response to such requirements, multi-pin probes 20 are used. There is also a need to reduce damage to the semiconductor device 200 due to contact with the probe 20. For this reason, probes 20 with thin wire structures, such as small-diameter, thin pin-type probes, fine wire-type probes, and the like, have been proposed. According to the semiconductor testing apparatus 101 illustrated in Embodiment 1, even when the probes 20 having thin wire structures are used, deformation of the probes 20 is suppressed to be caused by contact when pressurizing. Therefore, the reliability of the test results is improved and stabilized.

The protection member 30D of the separation section 30 in Embodiment 1 is made of a flexible elastic body. Therefore, the durability of the lower part of the first side wall 30B, which is repeatedly contacted, increases with each test of the semiconductor devices 200 to be tested. Further, the contact and adhesion properties between the first side wall 30B and the semiconductor device 200 are improved.

Embodiment 2

In Embodiment 2, the same reference numerals are given to the same components as those in Embodiment 1, and detailed description thereof will be omitted.

FIG. 5 is a cross-sectional view illustrating a configuration of a semiconductor testing apparatus 102 according to Embodiment 2. FIG. 6 is a diagram illustrating a cross-sectional configuration and a planar configuration of the semiconductor testing apparatus 102. The cross-sectional view illustrated on the upper side of FIG. 6 illustrates the cross section taken along C-C illustrated in the plan view illustrated on the lower side. The plan view in FIG. 6 illustrates the planar configuration of the semiconductor testing apparatus 102, with some parts seen through.

A separation section 31 includes an upper plate 31A, a first side wall 31B, a second side wall 31C, and a protection member 31D. The lower surface of the upper plate 31A is located below the lower surface of the upper plate 30A of Embodiment 1. During testing, the upper plate 31A is provided to approach the breakdown voltage holding region 202.

A gas supply section 40 includes a gas flow path 40B. The gas flow path 40B is provided so as to extend through the upper plate 31A. Here, the gas flow path 40B is provided along the first side wall 31B. In other words, the gas flow path 40B is provided so as to be in contact with the first side wall 31B.

The operation of the semiconductor testing apparatus 102 in Embodiment 2 is basically the same as the operation of the semiconductor testing apparatus 101 in Embodiment 1 (FIG. 4). However, some details of Steps S13 to S15 in FIG. 4 are different from Embodiment 1.

In Step S13, the separation section 31 descends and approaches the semiconductor device 200. The separation section 31 covers the pressurized space 50 above the breakdown voltage holding region 202. As the separation section 31 descends, the protection member 30D of the first side wall 30B comes into contact with the upper surface of the semiconductor device 200, and the upper plate 31A of the separation section 31 approaches the breakdown voltage holding region 202. The distance between the upper plate 31A and the breakdown voltage holding region 202 in Embodiment 2 is shorter than the distance between the upper plate 30A and the breakdown voltage holding region 202 in Embodiment 1. The first side wall 31B separates the probe space 60 from the pressurized space 50. The second side wall 31C located outside the outer edge portion of the semiconductor device 200 is not in contact with the stage 10.

In Step S14, the gas supply section 40 supply gas to the pressurized space 50 through the gas flow path 40B to pressurize the pressurized space 50. The gas supply sections 40 in Embodiment 2 are controlled to be able to supply gas based on detection of contact between the protection member 31D of the first side wall 31B and the front surface of the semiconductor device 200. The gas supplied to the pressurized space 50 through the gas flow path 40B is blown to the breakdown voltage holding region 202. As a result, foreign matter on the breakdown voltage holding region 202 is blown away. The foreign matter is discharged from the gap between the lower end of the second side wall 31C and the stage 10 since the second side wall 31C is not in contact with the stage 10.

In Step S15, the pressure adjustment section adjusts the pressure in the pressurized space 50. The pressure adjustment section adjusts the supply amount of gas to be supplied to the pressurized space 50, for example, through the gas supply section 40.

The pressurized space 50 is also pressurized in the test performed by the semiconductor testing apparatus 102 as described above. Therefore, the possibility of occurrence of partial discharge is lowered.

When gas is supplied from the gas supply sections 40 to the pressurized space 50, the pressurized space 50 is separated from the probe space 60 by the first side wall 31B. Therefore, high pressure gas is not blown to the probes 20 in the probe space 60. Therefore, regardless of the type of probes 20, deformation of the probes 20 due to blowing is suppressed.

In Embodiment 2, the lower surface of the upper plate 31A of the separation section 31 is close to the breakdown voltage holding region 202 of the semiconductor device 200. This narrows the pressurized space 50, and increases the flow velocity of the gas supplied from the gas supply section 40. As a result, foreign matter on the breakdown voltage holding region 202 is effectively blown away. Further, the volume of the pressurized space 50 being small allows the pressurized space 50 to be effectively pressurized.

Embodiment 3

In Embodiment 3, the same reference numerals are given to the same components as those in Embodiment 1, and detailed description thereof will be omitted.

FIG. 7 is a cross-sectional view illustrating a configuration of a semiconductor testing apparatus 103 according to Embodiment 3. FIG. 8 is a diagram illustrating a cross-sectional configuration and a planar configuration of the semiconductor testing apparatus 103. The cross-sectional view illustrated on the upper side of FIG. 8 illustrates the cross section taken along D-D illustrated in the plan view illustrated on the lower side. FIG. 9 is a diagram illustrating a cross-sectional configuration and a planar configuration of the semiconductor testing apparatus 103. The cross-sectional view illustrated on the upper side of FIG. 9 illustrates the cross section taken along E-E illustrated in the plan view illustrated on the lower side. The plan views in FIGS. 8 and 9 illustrate the planar configuration of the semiconductor testing apparatus 103, with some parts seen through.

The semiconductor testing apparatus 103 includes a stage 10, a plurality of probes 20, a separation section 32, a plurality of gas supply sections 40, a pressure adjustment section (not illustrated), and an exhaust section (not illustrated).

The separation section 32 includes an upper plate 30A, a first side wall 30B, a second side wall 30C, a first protection member 32D, and a second protection member 32E. The first protection member 32D is provided at the lower end of the first side wall 30B. The second protection member 32E is provided at the lower end of the second side wall 30C. The first protection member 32D and the second protection member 32E are made of, for example, a flexible elastic body. The cross sectional form comprised of the upper plate 30A, the first side wall 30B, the second side wall 30C, the first protection member 32D, and the second protection member 32E takes an inverted U-shape.

The plurality of gas supply sections 40 supply gas to the pressurized space 50 during testing. Each gas supply section 40 is controlled to be able to supply gas based on detection of contact between the second protection member 32E of the second side wall 30C and the front surface of the stage 10. Each gas supply section 40 includes an ejection port 40A illustrated in FIG. 9 that is installed to blow gas from an oblique direction onto the upper surface of the semiconductor device 200. The plurality of gas supply sections 40 are arranged so as to coincide with the corners of the breakdown voltage holding region 202 of the semiconductor device 200 in plan view. Each gas supply section 40 is provided so that the gas blown out from each ejection port 40A forms a flow that circulates around the ring-shaped pressurized space 50. Further, each gas supply section 40 is preferably provided so as to uniformly pressurize the pressurized space 50 when supplying gas.

The exhaust section (not illustrated) exhausts gas from the pressurized space 50. The pressure adjustment section adjusts the pressure in the pressurized space 50. The pressure adjustment section adjusts the supply amount of gas to be supplied to the pressurized space 50 by the gas supply sections 40 or the amount of gas exhausted from the pressurized space 50 by the exhaust section.

The operation of the semiconductor testing apparatus 103 in Embodiment 3 is basically the same as the operation of the semiconductor testing apparatus 101 in Embodiment 1 (FIG. 4). However, some details of Steps S13 and S14 in FIG. 4 are different from Embodiment 1.

In Step S13, the separation section 32 descends and approaches the semiconductor device 200. The separation section 32 covers the pressurized space 50 above the breakdown voltage holding area 202. As the separation section 32 descends, the first protection member 32D of the first side wall 30B comes into contact with the semiconductor device 200 and the second protection member 32E of the second side wall 30C comes into contact with the stage 10. The first side wall 30B separates the probe space 60 from the pressurized space 50. Further, the pressurized space 50 is sealed by the separation section 32, the semiconductor device 200, and the stage 10.

In Step S14, the gas supply sections 40 supply gas to the pressurized space 50 and the exhaust section exhausts gas from the pressurized space 50. The gas supply sections 40 according to Embodiment 3 are controlled to be able to supply gas based on detection of contact between the protection member 30E of the second side wall 30C and the front surface of the stage 10. The ejection ports 40A of the gas supply sections 40 in FIG. 9 blow gas from an oblique direction to the breakdown voltage holding region 202 of the semiconductor device 200. The gas blown from the oblique direction removes foreign matter adhering to the breakdown voltage holding region 202 of the semiconductor device 200. Further, in Embodiment 3, the gas ejection ports 40A are arranged to coincide with the corners of the breakdown voltage holding region 202 of the semiconductor device 200, this produces an efficient rotational flow of gas. As a result, the foreign matter removing effect is improved. Further, along with the gas in the pressurized space 50 being exhausted from the exhaust section, foreign matter that has separated from the breakdown voltage holding region 202 is discharged to the outside of the pressurized space 50.

The pressurized space 50 is also pressurized in the test performed by the semiconductor testing apparatus 103 as described above. Therefore, the possibility of occurrence of partial discharge is effectively lowered. When gas is supplied to the pressurized space 50, the pressurized space 50 is sealed. Therefore, high pressure gas is not blown to the probes 20 in the probe space 60. Therefore, regardless of the type of probes 20, deformation of the probes 20 due to blowing is suppressed.

Modification of Embodiment 3

FIG. 10 is a cross-sectional view illustrating a configuration of a semiconductor testing apparatus 104 according to Modification of Embodiment 3. The semiconductor testing apparatus 104 has a configuration in which a probe substrate 21 and the separation section 30 of the semiconductor testing apparatus 103 illustrated in Embodiment 3 are integrated. Specifically, the probe substrate 21 is bonded to the upper end of the first side wall 30B of the separation section 30.

During testing, the separation section 30 descends, the first protection member 32D of the first side wall 30B comes into contact with the semiconductor device 200. The probe space 60 is sealed by the probe substrate 21, the first side wall 30B of the separation section 30, the first protection member 32D, and the upper surface of the semiconductor device 200.

With such a configuration as well, the same effects as those in Embodiment 3 can be obtained. Further, the configuration in which the probe substrate 21 and the separation section 30 are integrated is also applicable to the semiconductor testing apparatus 101 of Embodiment 1 and the semiconductor testing apparatus 102 of Embodiment 2.

It should be noted that Embodiments of the present disclosure can be arbitrarily combined and can be appropriately modified or omitted without departing from the scope of the invention.

Hereinafter, the aspects of the present disclosure will be collectively described as Appendices.

APPENDIX 1

A semiconductor testing apparatus configured to evaluate electrical properties of a semiconductor device, comprising:

a stage;

a probe that performs electrical input and output to and from the semiconductor device held on the stage;

a separation section capable of separating a space above the semiconductor device held on the stage into a pressurized space and a probe space including the probe; and a gas supply section that supplies gas to the pressurized space to pressurize the pressurized space.

APPENDIX 2

The semiconductor testing apparatus according to Appendix 1, further comprising an exhaust section that exhausts the gas from the pressurized space or a pressure adjustment section that adjusts a pressure of the pressurized space.

APPENDIX 3

The semiconductor testing apparatus according to Appendix 1 or 2, wherein the separation section has a ring shape in plan view.

APPENDIX 4

The semiconductor testing apparatus according to any one of Appendices 1 to 3, wherein
the gas supply section further includes an ejection port installed to blow the gas from an oblique direction to an upper surface of the semiconductor device.

APPENDIX 5

A method of manufacturing a semiconductor device wherein the semiconductor device is manufactured using the semiconductor testing apparatus according to any one of Appendices 1 to 4 configured to evaluate electrical properties of the semiconductor device, comprising the steps of:
holding the semiconductor device on the stage;
separating, by the separation section, a space above the semiconductor device held on the stage into the pressurized space and the probe space;
pressurizing, by the gas supply section supplying gas to the pressurized space, the pressurized space; and
after the steps, performing electrical input and output through the probe to and from the semiconductor device held on the stage.

APPENDIX 6

The method of manufacturing the semiconductor device according to Appendix 5, further comprising the step of
exhausting the gas from the pressurized space or adjusting a pressure of the pressurized space.

APPENDIX 7

The method of manufacturing the semiconductor device according to Appendix 5 or 6, wherein
the separation section has a ring shape in plan view.

APPENDIX 8

The method of manufacturing the semiconductor device according to any one of Appendices 5 to 7, wherein
in the step of supplying the gas, the gas is blown in an obliquely direction to an upper surface of the semiconductor device.

APPENDIX 9

The method of manufacturing the semiconductor device according to any one of Appendices 5 to 8, wherein
in the step of pressurizing the pressurized space, the pressurized space is sealed.

APPENDIX 10

The method of manufacturing the semiconductor device according to any one of Appendices 5 to 9, wherein
in the step of pressurizing the pressurized space, the prove space is sealed.

APPENDIX 11

The method of manufacturing the semiconductor device according to any one of Appendices 5 to 10, wherein in the step of performing electrical input and output to and from the semiconductor device, the pressure in the pressurized space is higher than the pressure in the probe space.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor testing apparatus configured to evaluate electrical properties of a semiconductor device, comprising:
a stage;
a probe that performs electrical input and output to and from the semiconductor device held on the stage;
a separation section capable of separating a space above the semiconductor device held on the stage into a pressurized space and a probe space including the probe, such that a portion of the semiconductor device is positioned within the pressurized space and a portion of the semiconductor device is positioned within the probe space, and the pressure in the pressurized space is higher than the pressure in the probe space; and
a gas supply section that supplies gas to the pressurized space to pressurize the pressurized space.

2. The semiconductor testing apparatus according to claim 1, further comprising
an exhaust section that exhausts the gas from the pressurized space or a pressure adjustment section that adjusts a pressure of the pressurized space.

3. The semiconductor testing apparatus according to claim 1, wherein
the separation section has a ring shape in plan view.

4. The semiconductor testing apparatus according to claim 1, wherein
the gas supply section further includes an ejection port installed to blow the gas from an oblique direction to an upper surface of the semiconductor device.

5. A method of manufacturing a semiconductor device wherein the semiconductor device is manufactured using the semiconductor testing apparatus according to claim 1 configured to evaluate electrical properties of the semiconductor device, comprising the steps of:
holding the semiconductor device on the stage;
separating, by the separation section, a space above the semiconductor device held on the stage into the pressurized space and the probe space;
pressurizing, by the gas supply section supplying gas to the pressurized space, the pressurized space; and
after the steps, performing electrical input and output through the probe to and from the semiconductor device held on the stage.

6. The method of manufacturing the semiconductor device according to claim 5, further comprising the step of
exhausting the gas from the pressurized space or adjusting a pressure of the pressurized space.

7. The method of manufacturing the semiconductor device according to claim 5, wherein
the separation section has a ring shape in plan view.

8. The method of manufacturing the semiconductor device according to claim 5, wherein
in the step of supplying the gas, the gas is blown in an obliquely direction to an upper surface of the semiconductor device.

9. The method of manufacturing the semiconductor device according to claim 5, wherein in the step of pressurizing the pressurized space, the pressurized space is sealed.

10. The method of manufacturing the semiconductor device according to claim 5, wherein in the step of pressurizing the pressurized space, the probe space is sealed.

11. A method of manufacturing a semiconductor device, the semiconductor device being manufactured using a semiconductor testing apparatus configured to evaluate electrical properties of a semiconductor device, the semiconductor testing apparatus comprising:

a stage;

a probe that performs electrical input and output to and from the semiconductor device held on the stage;

a separation section capable of separating a space above the semiconductor device held on the stage into a pressurized space and a probe space including the probe; and a gas supply section that supplies gas to the pressurized space to pressurize the pressurized space, the method comprising the steps of:

holding the semiconductor device on the stage;

separating, by the separation section, a space above the semiconductor device held on the stage into the pressurized space and the probe space;

pressurizing, by the gas supply section supplying gas to the pressurized space, the pressurized space; and after the steps, performing electrical input and output through the probe to and from the semiconductor device held on the stage while in the step of performing electrical input and output to and from the semiconductor device, the pressure in the pressurized space is higher than the pressure in the probe space.

* * * * *